(12) United States Patent
Eric

(10) Patent No.: US 8,711,639 B2
(45) Date of Patent: Apr. 29, 2014

(54) DATA PATHS USING A FIRST SIGNAL TO CAPTURE DATA AND A SECOND SIGNAL TO OUTPUT DATA AND METHODS FOR PROVIDING DATA

(75) Inventor: Lee Eric, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 7 days.

(21) Appl. No.: 12/938,130

(22) Filed: Nov. 2, 2010

(65) Prior Publication Data

US 2012/0110368 A1 May 3, 2012

(51) Int. Cl.
| G11C 7/10 | (2006.01) |
| G11C 7/00 | (2006.01) |
| G11C 8/00 | (2006.01) |
| G11C 8/18 | (2006.01) |
| G11C 19/00 | (2006.01) |

(52) U.S. Cl.
USPC .............. 365/189.05; 365/194; 365/233.1; 365/233.11; 365/233.12; 365/240

(58) Field of Classification Search
USPC .......... 365/189.05, 184, 194, 201, 230.06, 365/233.1, 233.11, 233.12, 233.13, 233.16, 365/233.17, 236, 240, 193
See application file for complete search history.

(56) References Cited

U.S. PATENT DOCUMENTS

| 5,416,749 | A | * | 5/1995 | Lai | 365/240 |
| 5,546,347 | A | | 8/1996 | Ko et al. | 365/221 |
| 5,691,956 | A | * | 11/1997 | Chang et al. | 365/230.06 |
| 5,841,732 | A | * | 11/1998 | Mick | 365/233.1 |
| 5,883,855 | A | * | 3/1999 | Fujita | 365/189.05 |
| 5,931,926 | A | | 8/1999 | Yeung et al. | 710/52 |
| 5,946,267 | A | * | 8/1999 | Pathak et al. | 365/233.1 |
| 6,000,037 | A | | 12/1999 | Herbert | 713/400 |
| 6,031,787 | A | * | 2/2000 | Jeddeloh | 365/233.1 |
| 6,101,136 | A | * | 8/2000 | Mochida | 365/194 |
| 6,580,660 | B1 | * | 6/2003 | Hernandez | 365/233.1 |
| 6,751,156 | B2 | * | 6/2004 | Hsu et al. | 365/194 |
| 6,819,624 | B2 | * | 11/2004 | Acharya et al. | 365/194 |
| 6,826,113 | B2 | * | 11/2004 | Ellis et al. | 365/194 |
| 7,158,440 | B2 | * | 1/2007 | Duh et al. | 365/233.1 |
| 7,178,001 | B2 | * | 2/2007 | Mes | 365/233.1 |
| 7,426,144 | B2 | * | 9/2008 | Fujisawa | 365/189.05 |
| 7,428,184 | B2 | * | 9/2008 | Dietrich | 365/233.1 |
| 7,719,922 | B2 | * | 5/2010 | Fujisawa | 365/233.11 |
| 7,975,164 | B2 | * | 7/2011 | Lee et al. | 365/194 |
| 7,990,800 | B2 | * | 8/2011 | Huang | 365/189.05 |
| 8,015,460 | B2 | * | 9/2011 | Grunzke | 365/201 |
| 8,122,218 | B2 | * | 2/2012 | Mes | 365/233.1 |

* cited by examiner

Primary Examiner — Trong Phan

(74) Attorney, Agent, or Firm — Dorsey & Whitney LLP

(57) ABSTRACT

Data paths, memories, and methods for providing data from memory are disclosed. An example read data path includes a delay path, and a clocked data register. The data path has a data propagation delay and is configured to receive data and propagate the data therethrough. The delay path is configured to receive a clock signal and provide a delayed clock signal having a delay relative to the clock signal that models the data propagation delay. The clocked data register is configured to clock in data responsive at least in part to the delayed clock signal. The clocked data register is further configured to clock out data responsive at least in part to the clock signal.

21 Claims, 5 Drawing Sheets

DATA PATHS USING A FIRST SIGNAL TO CAPTURE DATA AND A SECOND SIGNAL TO OUTPUT DATA AND METHODS FOR PROVIDING DATA

TECHNICAL FIELD

Embodiments of the invention relate generally to semiconductor memory, and more specifically, in one or more illustrated embodiments, to semiconductor memory having a data register, the data register clocked to capture read data responsive a first signal and to output read data responsive a second signal.

BACKGROUND OF THE INVENTION

Integrated circuits often operate based on a system clock signal that may be used to synchronize operation of components of the system. As faster operation of the system is desired, a clock frequency of the system clock will typically be increased. The operability of the integrated circuits should scale with the higher clock frequency to ensure error free operation at the higher speed.

An example of a circuit that is clocked at the frequency of a system clock is a read data path that provides data from, for example, a memory array to be output. FIG. 1 illustrates a read data path 100. The read data path 100 includes a multiplexer 112 coupled to a data cache register (DDC) and a databus 110. The DDC is segmented into two portions DDC0 and DDC1, each of which provides read data to a respective input of the multiplexer 112 in response to a clock signal CLK. The read data is provided from the DDC to the multiplexer 112 in an interleaved manner. The multiplexer 112 is controlled by the CLK signal to switch back and forth between providing read data from DDC0 and providing read data from DDC1 to a clocked data register 130 over the databus 110. Read data is clocked into (and out of) the clocked data register 130 responsive to the CLK signal.

Operation of the read data path 100 is described with reference to FIG. 2A. At time T0 a rising edge of the CLK signal clocks DDC0 and at time T1, after a propagation delay of DDC0, data "A" is provided (e.g. output) from DDC0 to the multiplexer 112. A falling edge of the CLK signal at time T2 clocks DDC1 and also controls the multiplexer 112 to couple the input from DDC0 to the databus 110 to provide read data A to the clocked data register 130. At time T3 read data "1" is output from DDC1 (delay relative to the falling edge of the CLK signal caused by DDC propagation delay) and at time T4, after a propagation delay of the multiplexer 112 and the databus 110, read data A arrives at the clocked data register 130. The data register is clocked by the rising edge of the CLK signal at time T5 (i.e., the next rising edge of the CLK signal following the rising edge that clocked DDC0 to release data A) to capture (e.g. clock in) read data A. Data 1 is provided by the multiplexer 112 over the databus 110 to the clocked data register 130 in response to the rising edge of the CLK signal at time T5. After the propagation delay of the multiplexer 112 and the data bus 110, data 1 arrives at the clocked data register 130 at time T6 and is captured by the falling edge of the CLK signal at time T7. Data captured by the clocked data register 130 are later output (e.g. clocked out) responsive to the CLK signal.

FIG. 2B illustrates operation of the read data path 100 with a CLK signal having twice the clock frequency of the CLK signal of FIG. 2A. At time T0 a rising edge of the CLK signal clocks DDC0 and at time T2, after a propagation delay of the DDC0, data "A" is output to the multiplexer 112. Due to the higher frequency of the CLK signal, a falling edge of the CLK signal occurs at time T1 before data A is provided to the multiplexer 112. The multiplexer 112 is controlled by the falling edge of the CLK signal at time T2 to provide data A to its output, and as a result, when data A is output by DDC0 data A is provided by the multiplexer 112 to the databus 110. Due to the propagation delay of the multiplexer 112 and the databus 110, data A is not provided to the clocked data register 130 until time T5. The rising edge of the CLK signal at time T3, however, is the edge designated to latch data A (i.e., the rising edge after the rising edge clocking DDC0) into the clocked data register 130. Consequently, unknown data on the databus at time T3 and not data A will be captured (e.g. latched) into the clocked data register 130. Similarly, data 1 provided by DDC1 in response to the falling edge of the CLK signal at time T1 will also not be correctly captured by the falling edge of the CLK signal at T5.

As shown by FIGS. 2A and 2B, although the read data path 100 may be operable for a clock signal having a first frequency, it may not be operable when the clock signal is scaled to a higher second frequency.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 3:
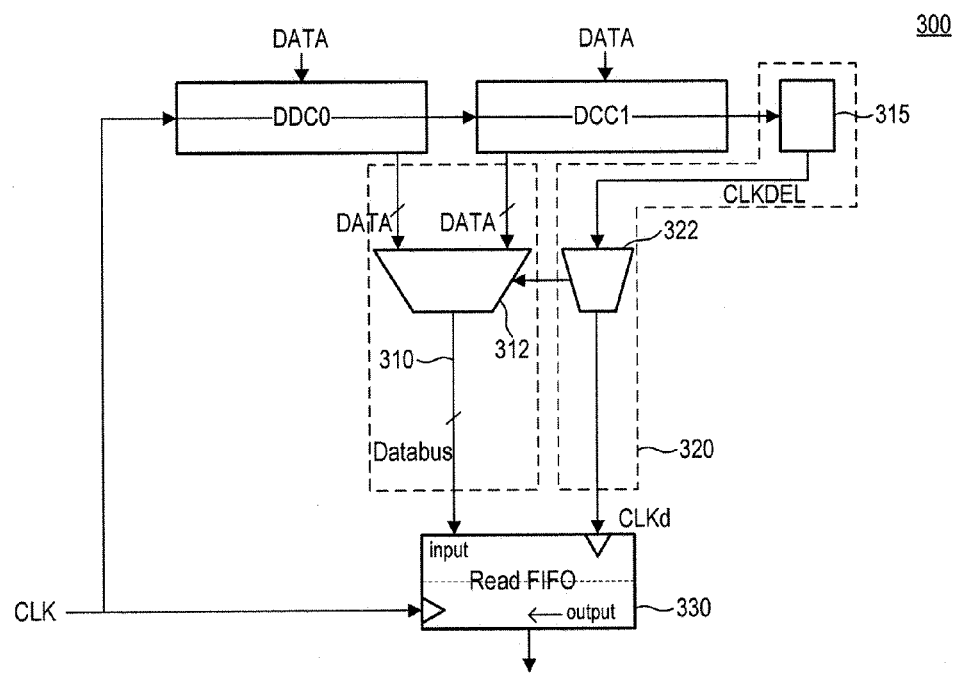
FIG. 3 is a block diagram of a read data path according to an embodiment of the invention.

FIG. 3 illustrates a read data path 300 according to an embodiment of the invention. The read data path 300 includes a multiplexer 312 coupled to receive read data from a data cache register (DDC) and provide the data to a data bus 310. The DDC is shown in FIG. 3 as being split into two functionally operable data cache registers DDC0 and DDC1, however, other data cache register configurations (e.g., splitting the DDC into greater or fewer functionally operable portions) may be used as well. DDC0 and DDC1 are provided data, for example, from memory (not shown in FIG. 3). As will be explained in more detail below, the data cache registers DDC0 and DDC1 are operated in an interleaved fashion to provide data to the multiplexer 312. That is, DDC0 provides data at a first time while DDC1 is loaded with data, and DDC1 provides data at a second time while DDC0 is loaded with data. The read data is provided over the databus 310 to a clocked data register 330 that clocks in the read data responsive to a first clock signal and outputs read data responsive to a second clock signal. The clocked data register 330 is illustrated in FIG. 3 as a first-in-first-out (FIFO) register, however, other clocked registers now known or later developed may be used as well. The read data path 300 further includes a matched delay path 320 that delays an input clock signal to provide a delayed clock signal CLKd to clock read data into the clocked read register 330. The delay path 320 includes a first model delay 315 that models a propagation delay of the DDC to provide a delayed clock signal CLKDEL. The output of the model delay 315 may be used to control input selection of the multiplexer 312. The delay path 320 further includes a second model delay 322 that receives the CLKDEL signal from the first model delay 315 and models a propagation delay of the multiplexer 312. The second model delay 322 provides the delayed clock signal CLKd to the clocked read register 330 over a signal path that generally matches (i.e. has approximately the same propagation delay as) the propagation delay of the databus 310.

In the embodiment of the read data path 300 shown in FIG. 3, a clock signal CLK is provided to the delay path 320 to provide the delayed clock signal CLKd to be used to clock read data into the clocked read register 330. The CLK signal may be used to clock read data out of the clocked read register 330. As will be described in more detail below, delaying the CLK signal by approximately the same propagation delay as the read data from the DDC and through the multiplexer 312 and over the databus 310, and clocking read data into the clocked read register 330 with the CLKd signal may facilitate accurate capturing (e.g. latching) of read data.

Figure 1:
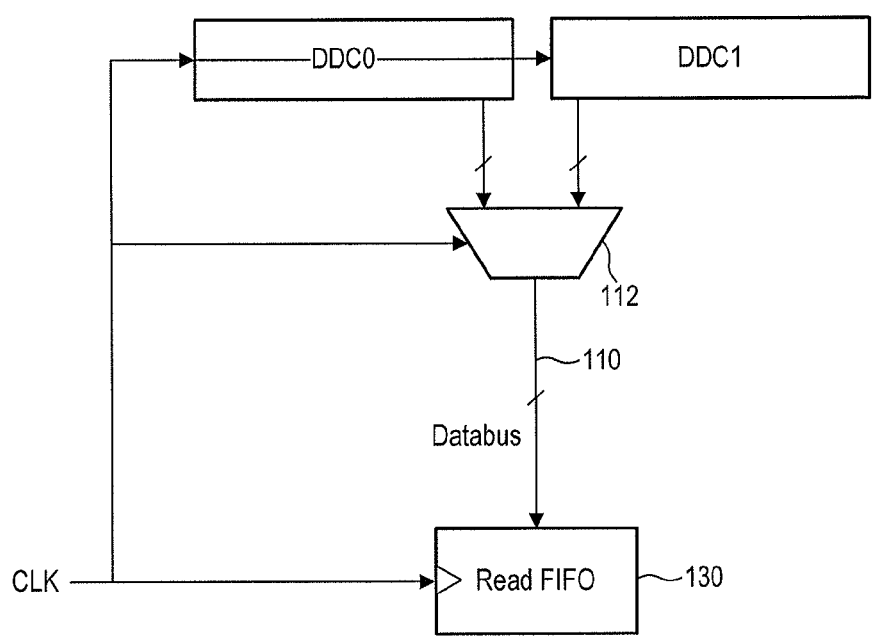
FIG. 1 is a block diagram of a conventional read data path.
Figure 2A:
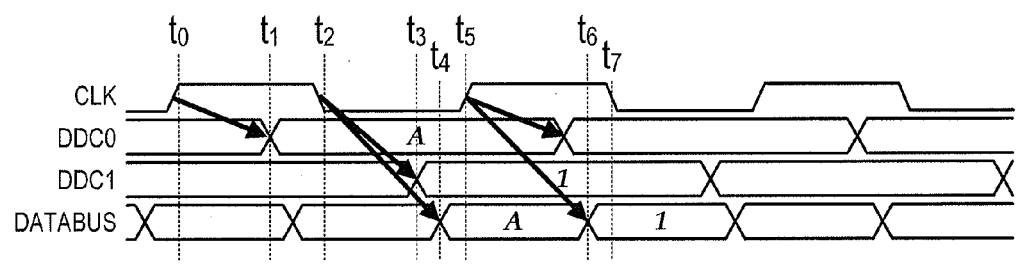
FIGS. 2A and 2B are timing diagrams of various signals during operation of the read data path of FIG. 1.
Figure 2B:
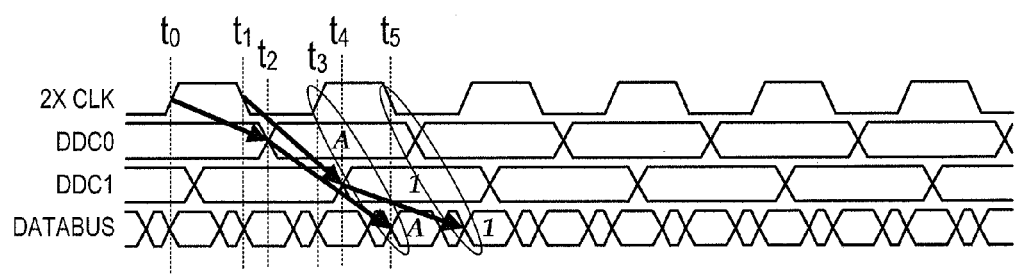
Figure 4:
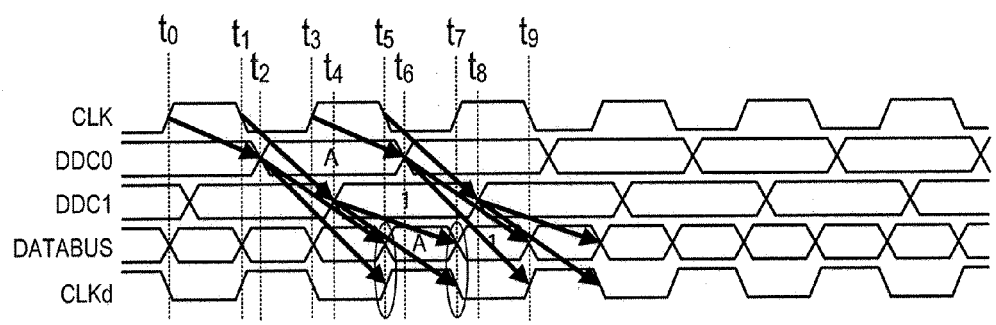
FIG. 4 is a timing diagram of various signals during operation of the read data path of FIG. 3 according to an embodiment of the invention.

FIG. 4 will be referenced to describe operation of the read data path 300 with a clock signal having a frequency approximately twice that of the CLK signal of FIG. 2A. As previously discussed, the read data path 100 of FIG. 1 was unable to accurately latch data from the DDC using a clock signal of this frequency.

In operation, at time T0 a clock transition of the CLK signal clocks the DDC0 and data "A" propagates through DDC0 to be output to the multiplexer 312 at time T2. The CLK signal is also provided to the delay path 320, which as previously discussed, includes the first model delay 315 that models a propagation delay of the DDC. This results in a delayed clock signal CLKDEL having clock transitions relative to clock transitions of the CLK signal with approximately the same delay data A has relative to the CLK signal clocking the DDC. As previously discussed, the CLKDEL signal may be used to control the multiplexer 312 in some embodiments. For example, the CLKDEL signal may be used to control which of the inputs of the multiplexer 312 is coupled to its output. In the embodiment the operation of which is shown in FIG. 4, the transition of the CLKDEL signal controls the multiplexer 312 to couple the input receiving data A from DDC0 to its output, resulting in data A being output to the data register 330 after a propagation delay of the multiplexer 312 (not shown in FIG. 4).

Data A arrives at the input of the data register 330 a finite time after being output from the multiplexer 312 due to a propagation delay of the databus 310 coupling the output of the multiplexer 312 to the data register 330. The CLKd signal is provided to the data register 330 by the model delay 322 and is based on the CLKDEL signal. The CLKd signal is delayed by an amount approximately equal to the propagation delay of the databus 310, and is used to clock the data register 330 at time T5 to capture data A. Although the rising edge of the CLKd signal at time T5 is illustrated as coincident with Data A becoming valid, the data register 330 may be configured to provide a finite delay from the rising edge (or falling edge) of the CLKd signal before actually latching data at its input to allow the data to stabilize. The CLK signal is used to later clock data A from the read register 330 (not shown in FIG. 4).

With respect to the interleaved operation of DDC1, after time T0 and before time T2 a clock transition of CLK at time T1 clocks the DDC1 and data "1" propagates from DDC1 to be output to the multiplexer 312 at time T4. The CLKDEL signal, which is delayed by the model delay 315, clocks the multiplexer 312 to couple the input receiving data 1 from DDC1 to its output. As with data A output by the multiplexer 312, data 1 is output by the multiplexer 312 in response to the clock transition of CLKDEL at T4 and will take a finite time to propagate over the databus 310 to the data register 330. As with clocking the data register 330 to capture data A, the delayed CLKd signal having a delay approximately equal to the propagation delay of data 1 from the multiplexer 312 to the read register 330 is used to clock the data register 330 to capture data 1. Data 1 is later clocked out of the data register 330 by the CLK signal.

As further shown in FIG. 4, a transition of the CLK signal at time T3 clocks the DDC0 and data "B" propagates through DDC0 to be provided to the multiplexer 312 at time T6. The CLKDEL signal having approximately the same delay relative to the CLK signal as the data propagation delay of the DDC controls the multiplexer 312 to couple the input receiving data B to its output responsive to the transition of the CLKDEL signal at time T6. Data B is output to the data register 330 after a propagation delay of the multiplexer 312 (not shown in FIG. 4) and is captured by the data register 330 at time T9 responsive to the CLKd signal. The CLKd signal, as previously discussed, has approximately the same propagation delay as data B over the data path. After time T3 and before time T6 a clock transition of CLK at time T5 clocks the DDC1 and data "2" propagates from DDC1 to be output to the multiplexer 312 at time T8. The CLKDEL signal, which is delayed by the model delay 315 of the delay path 320, clocks the multiplexer 312 to couple the input receiving data 2 from DDC1 to its output. Data 2 is output by the multiplexer 312 in response to the clock transition of CLKDEL at T8 and will take a finite time to propagate over the databus 310 to the data register 330. As with clocking the data register 330 to capture data B, the delayed CLKd signal having a delay approximately equal to the propagation delay of data 2 over the data path 310 is used to clock the data register 330 to capture data 2.

The operation of the read data path 300 to capture data output by the DDC in the interleaved manner continues as previously described. In summary, the read data path 300 facilitates accurately capturing read data into the data register 330 by delaying the clock signal used to clock data out from the DDC by a delay approximately equal to the propagation delay of the data path (e.g., propagation delay of DDC, multiplexer 312, and databus 310) to clock data into the data register 330. The read data is asynchronously loaded into the data register 330 by the delayed clock signal. Moreover, the read data path 300 may allow the datapath as a whole to be operated with a delay that is greater than a clock period of the CLK signal.

Figure 5:
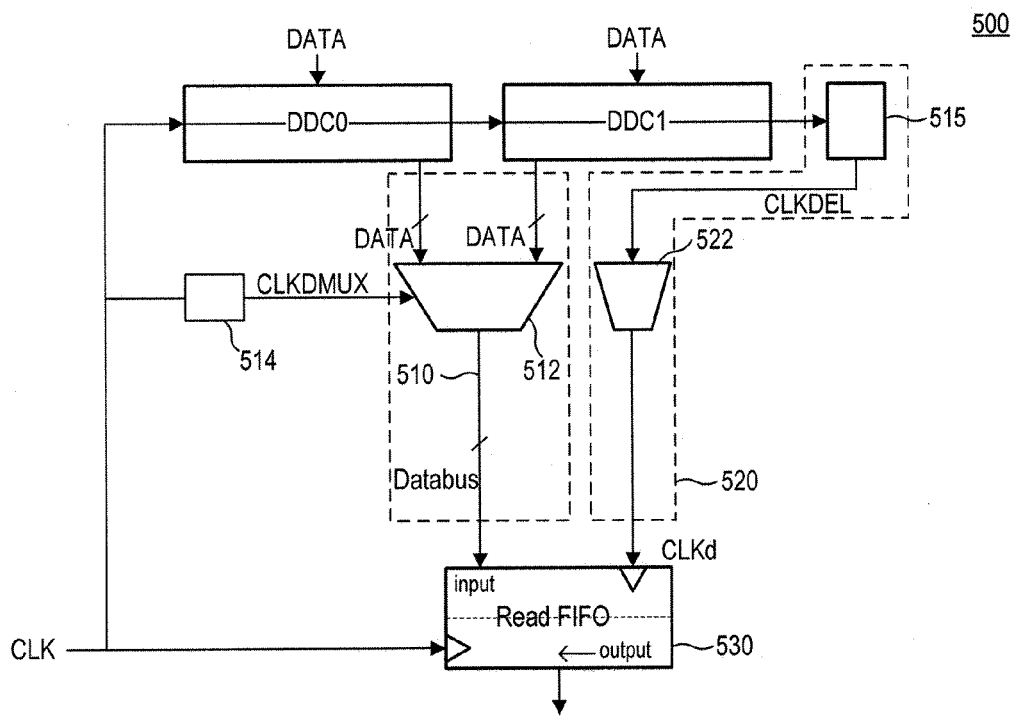
FIG. 5 is a block diagram of a read data path according to an alternative embodiment of the invention.

FIG. 5 illustrates a read data path 500 according to an embodiment of the invention. The data path 500 includes a multiplexer 512 coupled to receive read data from a data cache register (DDC) and a databus 510 on which data is provided by the multiplexer 512. As with the read data path 300 (FIG. 3), the DDC is shown in FIG. 5 as being split into two functionally operable data cache registers DDC0 and DDC1, however, other data cache register configurations may be used as well. DDC0 and DDC1 are provided data, for example, from memory (not shown in FIG. 5). The databus 510 provides read data to a clocked data register 530 that clocks in read data responsive to a first clock signal and outputs read data responsive to a second clock signal. The clocked data register 530 is illustrated in FIG. 5 as a first-in-first-out (FIFO) register, however, other clocked registers now known or later developed may be used as well. The read data path 500 further includes a delay path 520 that delays an input clock signal to provide a delayed clock signal. The delay path 520 includes a first model delay 515 that models a propagation delay of the DDC to provide a delayed clock signal CLKDEL, and further includes a second model delay 522 that receives the CLKDEL signal from the first model delay 515 and models a propagation delay of the multiplexer 512. The second model delay 522 provides a delayed clock signal CLKd to the clocked data register 530 over a signal path having a propagation delay matched to the databus 510.

The read data path 500 is similar to the read data path 300 of FIG. 3, but the multiplexer 512 is controlled by a delayed clock signal CLKDMUX provided by a delay 514 rather than a delayed version of the CLK signal provided by the matched delay path 520. The CLKDMUX signal is based at least in part on the CLK signal. The delay 514 may be a trimmable delay having a delay that can be adjusted by trimming. As with the read data path 300, however, the CLK signal is provided to the delay path 520 to provide a CLKd signal to the data register 530 having approximately the same delay as the propagation delay of DDC, multiplexer 512, and the databus 510 to clock read data into the clocked register 530. The CLK signal is used to clock read data out of the clocked data register 530. Operation of the read data path 500 is similar to that previously described with respect to the read data path 300 except that the multiplexer 512 switches between outputting data from DDC0 and DDC1 responsive to the CLKDMUX signal.

Figure 6:
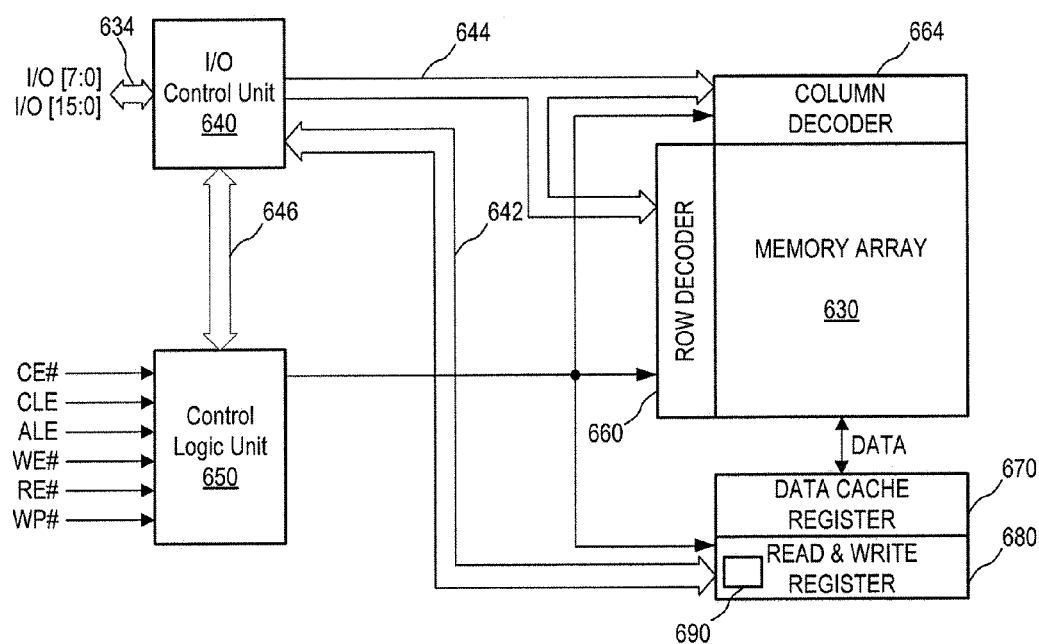
FIG. 6 is a block diagram of a memory including a read data path according to an embodiment of the invention.

FIG. 6 illustrates a memory 600 including a read data path according to an embodiment of the invention. The memory 600 includes an array 630 of memory cells arranged in banks of rows and columns. Command signals, the address signals and the write data signals are generally applied to the memory 600 as sets of sequential input/output ("I/O") signals (illustrated in the example of FIG. 6 as I/O[7:0] and/or I/O[15:0]) transmitted through an I/O bus 634. Similarly, read data signals are output from the memory 600 through the I/O bus 634. The I/O bus is connected to an I/O control unit 640 that routes the signals between the I/O bus 634 and an internal data bus 642, an internal address bus 644, and an internal command bus 646. The memory 600 also includes a control logic unit 65Q that receives a number of control signals either externally (illustrated in the example of FIG. 6 as CE#, CLE, ALE, WE#, RE#, and WP#) or through the command bus 646 to control the operation of the memory 600. The address bus 644 applies row address signals to a row decoder 660 and column address signals to a column decoder 664. Similarly, the column decoder 664 enables write data signals to be applied to bit lines for columns corresponding to the column address signals and allow read data signals to be coupled from bit lines for columns corresponding to the column address signals.

In response to the memory commands decoded by the control logic unit 650, the memory cells in the array 630 are erased, programmed, or read. The memory array 630 is programmed on a row-by-row or page-by-page basis. After the row address signals have been applied to the address bus 644, the I/O control unit 640 routes write data to a read and write register 680. The read and write register 680 provide the write data to a data cache register 670. The write data are stored in the data cache register 670 in successive sets each having a size corresponding to the width of the I/O bus 634. The data cache register 670 sequentially stores the sets of write data for an entire row or page of memory cells in the array 630. All of the stored write data are then used to program a row or page of memory cells in the array 630 selected by the row address coupled through the address bus 644. In a similar manner, during a read operation, read data from a row or page of memory cells selected by the row address coupled through the address bus 644 are stored in the data cache register 670. The read and write register 680 receives the read data from the data cache register 670 at a read data path 690, for example, a read data path according to an embodiment of the invention. Sets of read data corresponding in size to the width of the I/O bus 634 are then sequentially transferred through the I/O control unit 640 from the read and write register 680 to the I/O bus 634.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A data path, comprising:
 a delay path configured to receive a clock signal and provide a delayed clock signal having a delay relative to the clock signal that is approximately the same as a data propagation delay of the data path; and
 a clocked data register coupled to the delay path and configured to capture data responsive at least in part to the delayed clock signal and further configured to provide the data responsive at least in part to the clock signal.

2. The read path of claim 1, wherein the data path further comprises:
 a multiplexer having a plurality of inputs configured to receive the data and further configured to selectively output the data to the clocked data register from one of the plurality of inputs responsive at least in part on a multiplexer control signal; and
 a data bus coupled to the multiplexer, the data bus having a data bus propagation delay.

3. The data path of claim 2, wherein the delay path comprises:
 a model delay configured to provide a delay approximately equal to a first data propagation delay of a data cache register from which the data is received by the multiplexer and a second data propagation delay of the multiplexer; and
 a signal path coupled to the model delay and configured to have a propagation delay substantially equal to the data bus propagation delay.

4. The data path of claim 3, wherein the delay path is configured to provide a first delayed clock signal having the first data propagation delay, the multiplexer control signal based at least in part on the first delayed clock signal.

5. The data path of claim 3, wherein the delay comprises:
 a first model delay configured to model a propagation delay of the data cache register and a second model delay configured to model a propagation delay of the multiplexer.

6. The data path of claim 2, further comprising a data cache register coupled to the multiplexer.

7. The data path of claim 1, wherein the clocked data register comprises:
 a FIFO register.

8. A data path, comprising:
- a clocked data register configured to capture data responsive to a first clock signal and to provide the data responsive to a second clock signal; and
- a delay path coupled to the clocked data register and configured to receive the second clock signal and provide the first clock signal to the clocked data register, the first clock signal having a delay relative to the second clock signal, and wherein the first clock signal is provided by the delay path to clock the data into the clocked data register.

9. The data path of claim 2, wherein the multiplexer control signal is based at least in part on the clock signal.

10. The data path of claim 2, wherein the multiplexer control signal is provided by a trimmable delay configured to receive the second clock signal.

11. The data path of claim 8, wherein the delay path comprises:
- a model delay coupled to receive the second clock signal and configured to provide a delay approximately equal to a data propagation delay of a data cache register coupled to receive the second clock signal.

12. The data path of claim 8, wherein the data path further comprises:
- a data cache register coupled to receive the second clock signal and operated in an interleaved fashion to provide data to be captured by the clocked data register.

13. A memory, comprising:
- a memory array configured to store data;
- a data cache register coupled to the memory array and configured to receive the data from the memory array;
- a delay path coupled to the data cache register and configured to receive a clock signal and provide a delayed clock signal having a delay relative to the clock signal that is approximately equal to a propagation delay; and
- a clocked data register coupled to the delay path and configured to capture the data responsive at least in part to the delayed clock signal and further configured to provide the data responsive at least in part to the clock signal.

14. A method for providing data from memory, comprising:
- providing the data from a data cache register to a FIFO register responsive to a first clock signal;
- loading the data into the FIFO register asynchronously responsive to a second clock signal having a delay relative to the first clock signal; and
- providing the data from the FIFO register synchronously responsive to the first clock signal.

15. The method of claim 14, wherein providing data from a data cache register comprises providing the data from the data cache register in an interleaved manner.

16. The method of claim 15, further comprising controlling a multiplexer coupled to the data cache register responsive to a delayed clock signal, the delayed clock signal based at least in part on the first clock signal.

17. The method of claim 14, wherein the delay is substantially equal to a propagation delay of the data from the data cache register to the FIFO register.

18. A method for providing data from memory, comprising:
- loading a FIFO register with the data responsive at least in part to a first clock signal, the data provided from a data cache register to the FIFO register, the first clock signal having a delay relative to a second clock signal approximately equal to a data propagation delay from the data cache register to the FIFO register; and
- providing the data from the FIFO register and providing the data from the data cache register responsive at least in part to the second clock signal.

19. The method of claim 18, further comprising interleaving the providing of data from the data cache register.

20. The method of claim 18, further comprising delaying the second clock signal through a delay path to provide the first signal.

21. The method of claim 20, wherein the data propagation delay from the data cache register to the FIFO register includes a propagation delay of a data bus coupled to the FIFO register.

* * * * *

UNITED STATES PATENT AND TRADEMARK OFFICE
CERTIFICATE OF CORRECTION

PATENT NO. : 8,711,639 B2  Page 1 of 1
APPLICATION NO. : 12/938130
DATED : April 29, 2014
INVENTOR(S) : Eric Lee It is certified that error appears in the above-identified patent and that said Letters Patent is hereby corrected as shown below:

On the title page, in Item [75], in "Inventor", delete "Lee Eric," and insert -- Eric Lee, --, therefor.

Signed and Sealed this
Sixth Day of January, 2015

Michelle K. Lee
*Deputy Director of the United States Patent and Trademark Office*